(12) United States Patent
Mann et al.

(10) Patent No.: US 8,345,267 B2
(45) Date of Patent: Jan. 1, 2013

(54) APPARATUS FOR MICROLITHOGRAPHIC PROJECTION EXPOSURE AND APPARATUS FOR INSPECTING A SURFACE OF A SUBSTRATE

(75) Inventors: Hans-Juergen Mann, Oberkochen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/895,747

(22) Filed: Sep. 30, 2010

(65) Prior Publication Data

US 2011/0085179 A1    Apr. 14, 2011

Related U.S. Application Data

(63) Continuation of application No. PCT/EP2009/002302, filed on Mar. 30, 2009.

(60) Provisional application No. 61/072,980, filed on Apr. 4, 2008.

(30) Foreign Application Priority Data

Apr. 4, 2008 (DE) .......................... 10 2008 017 645

(51) Int. Cl.
*G01B 9/00* (2006.01)
*G01B 11/30* (2006.01)
*G01B 11/24* (2006.01)
*G01B 11/14* (2006.01)

(52) U.S. Cl. ........ 356/614; 356/124; 356/601; 356/609; 356/624; 382/141; 382/144; 382/145

(58) Field of Classification Search .......................... None
See application file for complete search history.

(56) References Cited

U.S. PATENT DOCUMENTS

| 4,540,277 | A | 9/1985 | Mayer et al. |
| 5,268,744 | A | 12/1993 | Mori et al. |
| 5,289,316 | A | 2/1994 | Fuerter |
| 5,978,071 | A | 11/1999 | Miyajima et al. |
| 6,240,158 | B1 | 5/2001 | Oshino |
| 6,481,003 | B1 * | 11/2002 | Maeda ............................ 430/22 |
| 6,538,740 | B1 | 3/2003 | Shiraishi et al. |
| 6,683,936 | B2 | 1/2004 | Jonkers |
| 6,765,647 | B1 * | 7/2004 | Nishi ............................. 355/55 |
| 6,784,977 | B2 | 8/2004 | von Buenau et al. |
| 6,806,456 | B1 | 10/2004 | Ye et al. |
| 7,081,949 | B2 | 7/2006 | Hara |
| 7,092,069 | B2 * | 8/2006 | Schuster ........................ 355/53 |
| 7,282,701 | B2 | 10/2007 | Kok et al. |
| 7,656,503 | B2 * | 2/2010 | Miura ............................ 355/55 |

(Continued)

FOREIGN PATENT DOCUMENTS

DE        4109484 C2      9/1992

(Continued)

*Primary Examiner* — Gordon Stock, Jr.
(74) *Attorney, Agent, or Firm* — Sughrue Mion, PLLC

(57) ABSTRACT

An apparatus (10) for microlithographic projection exposure, which includes: an optical system (18) for imaging mask structures (16) onto a surface (21) of a substrate (20) by projecting the mask structures (16) with imaging radiation (13), the optical system (18) being configured to operate in the EUV and/or higher frequency wavelength range, and various structure defining a measurement beam path (36) for guiding measurement radiation (34), the measurement beam path (36) extending within the optical system (18) such that the measurement radiation (34) only partially passes through the optical system (18) during operation of the apparatus (10).

30 Claims, 12 Drawing Sheets

U.S. PATENT DOCUMENTS

| | | |
|---|---|---|
| 7,682,031 B2 | 3/2010 | Mann et al. |
| 2002/0036762 A1 | 3/2002 | Nishi |
| 2003/0002023 A1 | 1/2003 | Bunau et al. |
| 2003/0142410 A1 | 7/2003 | Miyake |
| 2003/0234993 A1 | 12/2003 | Hazelton et al. |
| 2004/0239906 A1 | 12/2004 | Suzuki |
| 2005/0117140 A1 | 6/2005 | Mishima |
| 2005/0190435 A1 | 9/2005 | Shafer et al. |
| 2006/0023179 A1 | 2/2006 | Tschischgale et al. |
| 2006/0114476 A1 | 6/2006 | Kakuchi et al. |
| 2007/0080281 A1 | 4/2007 | Smith et al. |
| 2008/0252888 A1 | 10/2008 | Wegmann et al. |
| 2009/0091727 A1 | 4/2009 | Kwan |

FOREIGN PATENT DOCUMENTS

| | | |
|---|---|---|
| DE | 10120446 A1 | 11/2002 |
| DE | 10220816 A1 | 11/2003 |
| DE | 10323664 A1 | 12/2004 |
| DE | 102005056914 A1 | 5/2007 |
| DE | 102005062618 A1 | 7/2007 |
| EP | 0678768 A2 | 10/1995 |
| EP | 1093021 A2 | 4/2001 |
| EP | 1482368 A2 | 12/2004 |
| EP | 1496398 A1 | 1/2005 |
| EP | 1540423 B1 | 3/2007 |
| EP | 1950594 A1 | 7/2008 |
| EP | 1956339 A1 | 8/2008 |
| JP | 10-209039 A | 8/1998 |
| JP | 11238666 A | 8/1999 |
| JP | 2004356539 A | 12/2004 |
| JP | 2005166785 A | 6/2005 |
| WO | 9940613 A1 | 8/1999 |
| WO | 2004019128 A2 | 3/2004 |
| WO | 2006069725 A1 | 7/2006 |
| WO | 2007074134 A1 | 7/2007 |
| WO | 2007105406 A1 | 9/2007 |

* cited by examiner

US 8,345,267 B2

APPARATUS FOR MICROLITHOGRAPHIC PROJECTION EXPOSURE AND APPARATUS FOR INSPECTING A SURFACE OF A SUBSTRATE

This is a Continuation of International Application PCT/EP2009/002302, with an international filing date of Mar. 30, 2009, which was published under PCT Article 21(2) in German, and the complete disclosure of which is incorporated into the present application by reference. The present application claims the priority of German Patent Application 10 2008 017 645.1 and of U.S. Provisional Patent Application 61/072,980, both filed on Apr. 4, 2008, and the contents of which are also incorporated into the present application by reference.

FIELD OF AND BACKGROUND OF THE INVENTION

The invention relates to an apparatus for microlithographic projection exposure and to a method for determining a property of an arrangement which comprises an apparatus for microlithographic projection exposure and a substrate disposed in an exposure position of the apparatus. The invention further relates to an apparatus for inspecting a surface of a substrate and to a method for determining a property of an arrangement which comprises this type of inspection apparatus and a substrate. These types of inspection apparatuses include microscopes and optical inspection systems as used e.g. for the inspection of lithography masks or for the inspection of exposed wafers. Furthermore, they include optical systems for the calibration of mask patterning systems—so-called "registration units"—with which position marks can be measured with great precision on a lithography mask.

For the high precision imaging of micro- or nanostructures with the aid of a lithography exposure system it is important to know the position and the topography or the surface properties of the substrate to be exposed, e.g., in the form of a so-called wafer. In order to establish the position, focus sensors, for example, are used which, in direct proximity to a substrate table, guide a measurement signal such that it practically grazes the substrate plane and is then recaptured. In order to measure the substrate topography, measuring optics set up in parallel to the projection optics are often also used. This type of measuring optics is also called a "twin stage". This type of measuring optics set up in parallel is associated with increased complexity because additional optics and also an additional displacement stage are required.

With regard to the use of these types of metrology systems the difficulty arises, in particular for lithography exposure systems which are operated in the EUV wavelength range (wavelength range of extreme ultraviolet radiation, e.g. 13.4 nm) that the working space of these systems on the substrate side is determined by the penultimate mirror in the beam path. From the optical point of view, it is advantageous if this space can be chosen to be particularly small. However, a very small working space only leaves a small amount of or even no installation space for a conventional focus sensor.

OBJECTS OF THE INVENTION

It is an object of the invention to provide an apparatus and a method of the type specified above with which the aforementioned problems are addressed and/or resolved, and in particular with which a position of the substrate in relation to an imaging direction of the optical system can be determined with a smaller, or even the smallest possible, working space between the optical system and the substrate.

SUMMARY OF THE INVENTION

According to one formulation of the invention, an apparatus for microlithographic projection exposure is provided which has an optical system in the form of projection optics for imaging mask structures onto a surface of a substrate by projecting the mask structures with imaging radiation. The optical system is configured to operate in the EUV and/or higher frequency wavelength range, i.e. for wavelengths in the EUV range and/or for smaller wavelengths. This apparatus further has a measurement beam path for guiding measurement radiation. The measurement beam path extends within the optical system such that at least two optical elements of the optical system are included in the measurement path beam, and the measurement radiation only partially passes through the optical system during operation of the apparatus.

According to a further formulation of the invention, a method is provided for determining a property of an arrangement which comprises an apparatus for microlithographic projection exposure and a substrate disposed in an exposure position of the apparatus. Here the apparatus comprises an optical system for imaging mask structures onto the surface of the substrate by projecting the mask structures using imaging radiation in the EUV and/or higher frequency wavelength range. The method includes: guiding measurement radiation within the optical system such that at least two optical elements of the optical system are included in the measurement path beam, and the measurement radiation only partially passes through the optical system, and determining a property of the arrangement from the measurement radiation.

In other words, there is created within the optical system a beam path for measurement radiation with which a property of an arrangement which comprises the apparatus for microlithographic projection exposure and a substrate disposed in an exposure position can be determined. The optical system serves to image mask structures onto a surface of a substrate by projecting the mask structures with imaging radiation, and can also be called a projection objective of the projection exposure system. The optical system is configured to operate with imaging radiation in the EUV and/or higher frequency wavelength range. The EUV wavelength range is identified as the range below 100 nm, in particular the range between 5 nm and 20 nm. In particular, the optical system can be configured to operate with a wavelength of 13.5 nm or 6.9 nm. The configuration of the optical system to the aforementioned wavelength range generally requires the implementation of the optical system with purely reflective optical elements, and so as a so-called catoptric projection objective, and the provision of corresponding reflective coatings.

The measurement beam path extends within the optical system such that at least two optical elements of the optical system are included in the measurement beam path, and the measurement radiation only partially passes through the optical system during operation of the apparatus. It is to be understood from this that not all of the optical elements are included in the measurement beam path. An optical element can, for example, be included in the measurement beam path if the measurement radiation is reflected on the respective optical element. Another form of inclusion of an optical element in the form of a mirror on the measurement beam path can consist of the measurement radiation passing through an opening in this mirror. In other words, the measurement beam path only extends in sections within the optical system, and so there exists at least one optical element which is not included in the measurement beam path in the sense specified above.

According to one exemplary embodiment, the position of the substrate surface for at least one point on the substrate surface is measured as regards the imaging direction. If the optical system has an optical axis, which is the case when using rotationally symmetrical optical elements, the at least one point on the substrate surface is measured, in particular as regards its axial position, relative to the optical axis. The axial position is understood to be the position with regard to a coordinate axis which extends in the direction of the optical axis of the optical system.

The position of the substrate surface is then be determined by reflection of the measurement radiation on the substrate surface and subsequent analysis of the reflected measurement radiation. Due to the fact that the measurement radiation radiates from within the optical system onto the substrate surface, one can dispense with attaching measuring elements between the last element of the optical system and the substrate. In this way the working space between the reflective optical element lying closest to the substrate and the substrate can be kept very small. In the case where the measurement radiation is not reflected on the substrate, but rather e.g. on a mask having the mask patterns, corresponding advantages with regard to the working space between the reflective optical element lying closest to the mask and the mask are achieved. These or similar effects can be achieved correspondingly if it is not the position on the substrate surface, but generally a property of the arrangement that is determined.

In one embodiment, the measurement beam path is configured to measure, during operation of the apparatus, at least one point of the substrate surface as regards its position with the measurement radiation guided by the measurement beam path. In a further embodiment, the measurement beam path is configured to measure, during operation of the apparatus, the at least one point of the substrate surface as regards its position in the imaging direction of the optical system with the measurement radiation. Furthermore, the apparatus preferably has an analysis device which is configured to determine the position of the point of the substrate surface from the measurement radiation after the latter interacts with the substrate.

Generally, the apparatus according to one embodiment has an analysis device which is configured to determine a property of an arrangement of the measurement radiation and which includes the apparatus for projection exposure and the substrate.

According to one embodiment the measurement beam path is configured such that the measurement radiation is reflected on a surface of the substrate during operation of the apparatus. In this case the axial position on the substrate surface can then be determined from the measurement radiation reflected on the substrate surface. This can happen in different ways. For example, the measurement radiation reflected on the substrate surface can be determined with radiation moved past the optical system and passing back to the same radiation source as the measurement radiation, as described for example in U.S. 2007/0080281 A1. Furthermore, one can, for example, fall back on the measuring principle described in U.S. Pat. No. 5,268,744 wherein displacement of the substrate surface in the z direction brings about displacement of the measurement beam on a detector surface. A further measuring principle of distance measurement is described in DE4109484C2.

In a further embodiment, the measurement beam path is configured to measure, during operation of the apparatus, the at least one point of the substrate surface as regards its position lateral to the imaging direction of the optical system using the measurement radiation guided by the measurement beam path. In this way the position of the at least one point is measured in the lateral direction. This can happen in particular with the aid of adjustment marks. In the simplest case just one adjustment mark, which is located on the substrate, is required. This adjustment mark is imaged onto a detector with the measurement radiation. The lateral position of the adjustment mark is taken from the position of the imaged adjustment mark, and from this the lateral position of the substrate, and so the so-called alignment of the substrate can be determined.

In addition to the adjustment mark on the substrate, a further adjustment mark can also be provided as a reference, e.g. on a reference mirror. This type of reference mark can be disposed upstream or downstream of the substrate in the measurement beam path. In the case of the upstream positioning the measurement radiation strikes the adjustment mark on the substrate "pre-patterned", and in the case of the downstream positioning the measurement radiation patterned by the substrate mark is imaged onto the reference mark. In both cases an image, which includes the relative positions of the reference mark and the substrate mark, can be recorded by a downstream detector. From this the lateral position of the substrate mark relative to the reference mark can be determined. An example of this type of position determination using substrate and reference marks is the Moiré method. The Moiré measuring method, known in principle to the person skilled in the art, utilises the Moiré effect with which long-period brightness modulations are generated by overlaying two line grids the grid constants of which deviate only slightly from one another. By analysing the pattern produced, a relative displacement of the two grids in relation to one another can be determined with a high degree of precision. The Moiré analysis is advantageously implemented with the two-dimensional intensity pattern determined with the spatially resolving surface sensor.

For apparatuses for microlithographic projection exposure, in particular for methods which require high-precision lateral overlay of structures, and so have high "overlay" requirements, as is the case e.g. with double-patterning methods, this type of lateral position measurement is important. A measurement of the lateral position is also relevant to the inspection apparatuses described below. For these types of apparatus, also called "registration units", it is made possible to take a lateral position measurement, e.g. for a so-called "pre-alignment", i.e. a type of rough positioning. In one embodiment the high-precision measurement of the adjustment marks is then not implemented using the measurement beam path, but a different beam path, e.g. the imaging beam path.

In a further embodiment, the apparatus for microlithographic projection exposure has a substrate table displaceable laterally to the imaging direction and a control device. The control device is configured to control the apparatus such that during operation of the apparatus the at least one point of the substrate surface is measured at two different points in time as regards its position lateral to the imaging direction, and the apparatus is set up to determine from this a lateral displacement speed or a so-called "scan speed" of the substrate table. The substrate is held by the substrate table which can also be called the "wafer stage".

In a further embodiment, the measurement beam path is configured such that during operation of the apparatus the measurement radiation is reflected on a surface of the substrate.

In a further embodiment, the apparatus has a measurement radiation source which generates the measurement radiation with at least two different wavelengths. Furthermore, the apparatus comprises a wavelength-resolving radiation detector which is configured to measure the respective intensity of the measurement radiation following reflection on the substrate for each of the at least two different wavelengths, and to determine from this the temperature on the substrate surface. This takes place in the same way as temperature determination with an infrared thermometer.

In a further embodiment, the mask structures to be imaged are disposed on a mask, and the measurement beam path is configured such that during operation of the apparatus the measurement radiation is reflected on a surface of the mask facing towards the optical system.

In a further embodiment, the apparatus comprises a mask table that can be displaced laterally to the imaging direction and a control device which is configured to control the apparatus for microlithographic projection exposure such that during operation of the apparatus the at least one point of the substrate surface is measured as regards its position lateral to the imaging direction at two different points in time, the apparatus being set up to determine from this a lateral displacement speed of the mask table.

In a further embodiment, the apparatus comprises a measurement radiation source which generates the measurement radiation with at least two different wavelengths. Furthermore, the apparatus includes a wavelength-resolving radiation detector which is configured to measure the respective intensity of the measurement radiation following reflection on the mask surface for the at least two different wavelengths, and from this to determine the temperature on the substrate surface.

In a further embodiment, the apparatus is configured to determine, during operation of the apparatus, a reduction in intensity of the measurement radiation upon passing through the optical system, and to determine from this a concentration of a gas contained in the optical system. This gas surrounds the optical elements of the optical system. This can also be a residual gas of an optical system operated in a vacuum.

In a further embodiment, the apparatus further comprises an optical injecting element which is provided for injecting the measurement radiation into the optical system. Moreover, an optical extracting element, which is provided for extracting the measurement radiation from the optical system, can be provided. For this purpose two deflection mirrors can be provided which are configured to reflect the measurement radiation. The deflection mirrors are advantageously independent of the at least one reflective optical element of the optical system. In one embodiment the first deflection mirror is positioned such that it steers the measurement radiation onto one of the reflective optical elements or, in the embodiment in which one of the reflective optical elements has an opening, onto this opening.

In a further embodiment, the measurement beam path is configured such that, during operation of the apparatus, the measurement radiation is reflected on the surface of the substrate or the surface of the mask between injection into the optical system and extraction from the optical system. In this way it is possible to determine an axial position of the substrate on the reflection point relative to the optical system.

In a further embodiment, the optical system has at least one reflective optical element, and the measurement beam path extends within the optical system such that during operation of the apparatus the measurement radiation is reflected on the at least one reflective optical element. According to a further variation the measurement beam path extends within the optical system such that during operation of the apparatus the measurement radiation passes through an opening in the at least one reflective optical element.

In a further embodiment, the apparatus further comprises a substrate plane into which the mask structures are imaged during operation of the apparatus, the measurement beam path being configured such that the measurement radiation is focussed onto the substrate plane.

In a further embodiment, an obscuration aperture is disposed in a pupil plane of the optical system. This type of obscuration aperture is also called a shading aperture. This can be created, for example, using a non-reflective coating with regard to radiation with the wavelength of the imaging radiation. This type of obscuration aperture is often used to avoid a high degree of light loss in the beam path of the imaging radiation because in an obscured system smaller angles of incidence can be achieved, as described, for example, in WO 2006/069725 A1. An obscuration aperture often blocks the imaging radiation in a central region of the beam cross-section. By positioning an obscuration aperture in a pupil plane area-independent obscuration of the pupil can be achieved. This type of optical system with an obscured pupil benefits particularly in the context of the invention because the size of the obscuration can be smaller the smaller the working space between the optical system and the substrate.

In a further embodiment, the at least one reflective optical element has an opening, and the measurement beam path extends through this opening. The at least one reflective optical element having the opening is downstream in relation to the obscuration aperture in the beam path of the imaging radiation, the opening being disposed in a region of the reflective optical element which is at least partially shaded from the imaging radiation by the obscuration aperture. Therefore, the imaging characteristics of the optical system are not negatively effected by the measurement radiation.

In a further embodiment, an obscuration aperture is disposed in a first pupil plane, the optical system has a further pupil plane downstream in relation to the obscuration aperture in the imaging beam path which is shaded in some regions by the obscuration aperture, and the measurement beam path extends at least once through the further pupil plane, at least partially in the shaded region. The further pupil plane can be disposed, for example, between the penultimate and the last reflective optical element of the optical system before the substrate. Preferably the measurement radiation passes through the further pupil plane twice.

In a further embodiment, the measurement beam path extends at least once through a pupil plane of the optical system.

In a further embodiment, at least one of the reflective optical elements has an opening, and the measurement beam path extends through this opening. In this embodiment the opening is disposed in a central region of the at least one reflective optical element. By positioning the opening in the central region of the reflective optical element, the opening has, if it has any effect at all, a symmetrical effect upon the imaging beam path in the optical system. In this way imaging errors when imaging the mask structures with the optical system are avoided.

In a further embodiment, the optical system comprises at least two reflective optical elements, and the measurement beam path extends through both openings. In one embodiment the reflective optical elements having the respective openings are disposed in a high-aperture part of the optical system, in particular these are the last two reflective optical elements of the optical system.

In a further embodiment, the at least one reflective optical element has an opening, and the measurement beam path is configured such that during operation of the apparatus the measurement radiation passes through the opening and is reflected on at least one other reflective optical element of the optical system. In this way, aspects and benefits associated with the invention can be realised through a variety of optical designs for the optical system.

In a further embodiment, the measurement beam path is configured such that during operation of the apparatus the measurement radiation is reflected on the at least one reflective optical element, the latter having a peripheral region disposed outside of the beam path of the imaging radiation, and the measurement beam path being configured such that the measurement radiation is reflected on the peripheral region. This peripheral region can, for example, have a reflective coating matched especially to the wavelength of the measurement radiation. Therefore, greatly differing wavelengths can be used for the imaging radiation and the measurement radiationa In a further embodiment, the measurement beam path is configured such that the measurement radiation is reflected twice on the at least one reflective optical element. Preferably the measurement radiation is reflected once prior to reflection on the substrate, and once after this on the respective reflective optical element. Therefore, the measurement radiation reflected on the substrate can also be guided through the interior of the optical system to a detector device so that no further optical element need be disposed between the last optical element and the substrate plane. Therefore, the working space of the optical system can remain unaffected by the detection of the measurement radiation.

In a further embodiment, the optical system comprises a number of optical elements, and the measurement beam path is configured such that during operation of the apparatus the measurement radiation is reflected on at least two, in particular on three, four, five, six, etc. of the reflective optical elements. In one embodiment the reflection on the reflective optical elements takes place before the measurement radiation strikes the substrate, and then the measurement radiation is reflected once again on said reflective optical elements.

In a further embodiment, none of the reflective optical elements of the optical system has an opening in the optically used region of an optical area. Therefore, the optical areas of the reflective optical elements are all designed to be continuous. Therefore, within the optical system the measurement radiation is either reflected on a respective reflective optical element or runs past it.

In a further embodiment, the measurement beam path is configured such that the relative position of at least two points on the surface of the substrate, in particular the topography of at least one section of the surface of the substrate, can be measured with the measurement radiation guided therein. In other words, a number of points on the surface of the substrate are measured as regards their relative axial position in relation to one another with the measurement radiation. From this the surface properties of the substrate surface can be determined. From the surface properties determined matching of the exposure conditions with regard to the focus setting for the imaging of the mask structures onto the substrate surface can in turn take place.

In a further embodiment, at a given time during operation of the apparatus a limited area on the substrate is exposed with the imaging radiation, and the measurement beam path is configured such that at the time of exposing the substrate the measurement radiation is directed onto the exposed area. Therefore, the position measurement on the surface of the substrate takes place simultaneously during exposure of the respective substrate area. Any possible errors in the position caused by a scanning movement of the substrate can be eliminated by the simultaneous measurement. The exposed area on the substrate at any given time can in the case of a projection exposure system in the form of a so-called stepper be e.g. the whole exposed field on the wafer, or in the case of a projection exposure system in the form of a so-called scanner, be a slot-shaped area illuminated by the exposure slot.

In a further embodiment, the apparatus is configured as a scanner wherein during operation a slot-shaped area on the substrate is exposed by an exposure beam, the substrate being moved relative to the exposure beam so that the exposed area is displaced on the substrate. In this embodiment the measurement beam path is configured such that the measurement radiation is directed towards a section of the substrate which during exposure operation of the exposed area runs ahead and/or runs behind. In the case where the measurement radiation is directed towards the section running ahead of the exposed area there is the advantage that prior to exposure of the section of the substrate "sampled" in advance using the measurement radiation, the focus settings required for exposure are already provided. Therefore, there is sufficient lead time in order to establish an optimal focus setting, for example by mechanical manipulations, for the exposure of the substrate section. In the case of "subsequent measurement" of the substrate surface the measurement result can serve, for example, to verify the imaging settings in retrospect or also for quality control of the exposure.

In a further embodiment, the apparatus is configured to determine the position of the at least one point of the substrate surface while at the same time imaging the mask structures onto the substrate surface. In this case the measurement of the substrate surface during the exposure operation takes place in real time.

According to another aspect of the invention, furthermore, an apparatus for microlithographic projection exposure is provided comprising: an optical system for imaging mask structures onto a surface of a substrate by projecting the mask structures in an imaging direction with imaging radiation, the optical system having at least one reflective optical element and a measurement beam path for guiding measurement radiation, the measurement radiation serving to measure at least one point of the substrate surface as regards its position in the projection direction, and the measurement beam path being configured such that during operation of the apparatus the measurement radiation is reflected on at least one of the reflective optical elements.

Moreover, an apparatus for microlithographic projection exposure is provided comprising: an optical system for imaging mask structures onto a surface of a substrate by projecting the mask structures with imaging radiation, the optical system having at least one reflective optical element. Furthermore, the optical system comprises a measurement beam path for guiding measurement radiation, the measurement beam path extending, in particular in sections, within the optical system such that during operation of the apparatus the measurement radiation is reflected on the at least one reflective optical element and, furthermore, on the surface of the substrate.

The reflective optical element is in particular an optical element generating the imaging beam path. In other words, in this case the reflective optical element is positioned within the optical system such that it reflects the imaging radiation onto the surface of the substrate when imaging the mask structures. It is therefore an imaging optical element of the optical system with regard to the imaging of the mask structures.

Moreover, an apparatus for microlithographic projection exposure is provided. This apparatus comprises: an optical system for imaging mask structures onto a surface of a substrate by projecting the mask structures with imaging radiation, the optical system having at least one reflective optical element. Furthermore, the apparatus comprises a measurement beam path for guiding measurement radiation, the measurement beam path extending, at least in sections, within the optical system such that during operation of the apparatus the measurement radiation passes through an opening in the at least one reflective optical element and, furthermore, is reflected on the surface of the substrate. In the present case the optical system can be configured as a catadioptric system which, in addition to the at least one reflective optical element, comprises at least one refractive or diffractive optical element, but also as a catoptric system.

Furthermore, according to another aspect of the invention, a method is provided for determining a property of an arrangement which comprises an apparatus for microlithographic projection exposure and a substrate disposed in an exposure position of the apparatus. The apparatus comprises an optical system for imaging mask structures onto the surface of the substrate by projecting the mask structures in an imaging direction using imaging radiation. The optical system has at least one reflective optical element, and the method comprises the steps: guiding measurement radiation within the optical system such that the measurement radiation is reflected on the at least one reflective optical element or passes through an opening in the at least one of the reflective optical elements, reflecting the measurement radiation on the surface of the substrate, and determining a property of the arrangement from the reflected measurement radiation.

Moreover, an apparatus for microlithographic projection exposure is provided which comprises: an optical system for imaging mask structures onto a surface of a substrate by projecting the mask structures in an imaging direction with imaging radiation, the optical system having at least one reflective optical element. The apparatus further comprises a measurement beam path for guiding measurement radiation, which serves to measure at least one point of the substrate surface as regards its position in the imaging direction. Here at least one of the reflective optical elements has an opening, and the measurement beam path extends through this opening.

Furthermore, a method is provided for determining a position on a surface of a substrate which is disposed in an exposure position in an apparatus for microlithographic projection exposure. The apparatus has an optical system here for imaging mask structures onto the surface of the substrate by projecting the mask structures using imaging radiation. The optical system has at least one reflective optical element, and the method according to one formulation, comprises: guiding measurement radiation, in sections, within the optical system such that the measurement radiation is reflected on the at least one reflective optical element or passes through an opening in the at least one reflective optical element, reflecting the measurement radiation on at least one point on the surface of the substrate, and determining a position of the at least one point of the substrate surface relative to the imaging direction from the reflected measurement radiation. Preferably said opening in the reflective optical element is designed such that the imaging of the mask structures onto the surface of the substrate is not or is only slightly affected by the imaging radiation through the opening. In the case where the optical system has a partially obscured pupil, the opening can be positioned in an obscured region of the imaging beam path.

As already mentioned above, the apparatus can be configured as a projection exposure system for microlithography, in particular as an EUV projection exposure system.

Furthermore, according to yet another formulation of the invention, an apparatus for inspecting a surface of a substrate is provided comprising: an optical system for imaging at least one section of a surface of a substrate to be inspected into a detection plane by imaging the section with imaging radiation, the optical system having at least one reflective optical element, and a measurement beam path for guiding measurement radiation, the measurement beam path extending, in sections, within the optical system such that during operation of the apparatus the measurement radiation is reflected on the reflective optical element or passes through an opening in the reflective optical element.

Moreover, according to a further formulation of the invention, an apparatus for inspecting a surface of a substrate is provided comprising: an optical system for imaging at least one section of a surface of a substrate to be inspected into a detection plane by imaging the section in an imaging direction with imaging radiation, the optical system being configured to operate in the EUV and/or higher frequency wavelength range, and a measurement beam path for guiding measurement radiation, the measurement beam path extending within the optical system such that the measurement radiation only partially passes through the optical system during operation of the apparatus. Therefore, the substrate can be a semiconductor wafer, a lithography mask or in general an object to be inspected.

Moreover, a method for determining a property of an arrangement is provided which comprises an inspection apparatus and a substrate which is disposed in an inspection position in the inspection apparatus, the apparatus having an optical system for imaging at least one section of a surface of the substrate to be inspected into a detection plane by imaging the section using imaging radiation in the EUV and/or higher frequency wavelength range, the optical system comprising at least one reflective optical element, and the method comprising the steps: guiding measurement radiation within the optical system such that the measurement radiation only partially passes through the optical system, and determining a property of the arrangement from the measurement radiation.

Moreover, an apparatus for inspecting a surface of a substrate is provided comprising: an optical system for imaging at least one section of a surface of a substrate to be inspected into a detection plane by imaging the section in an imaging direction with imaging radiation, the optical system having at least one reflective optical element and a measurement beam path for guiding measurement radiation, the measurement beam path extending, in particular in sections, within the optical system such that during operation of the apparatus the measurement radiation is reflected on the at least one reflective optical element, or passes through an opening in the at least one reflective optical element.

According to one embodiment of this inspection apparatus, the latter has an analysis device which is configured to determine a property of an arrangement comprising the apparatus for projection exposure and the substrate from the measurement radiation. This type of property that can be determined with the analysis device can be e.g. the position of a point of the substrate surface.

Moreover, a method for determining a property of an arrangement is provided which comprises an inspection apparatus and a substrate which is disposed in an inspection position in the inspection apparatus, the apparatus having an optical system for imaging at least one section of a surface of the substrate to be inspected into a detection plane by imaging the section using imaging radiation, the optical system having at least one reflective optical element, and the method comprising the steps: guiding measurement radiation within the optical system such that the measurement radiation is reflected on the at least one reflective optical element, or passes through an opening in the at least one reflective optical element, reflecting the measurement radiation on the surface of the substrate, and determining a property of the arrangement from the reflected measurement radiation.

Moreover, according to a further aspect of the invention, a method is provided for determining a position on a surface of a substrate which is disposed in an inspection position in an inspection apparatus, the apparatus having an optical system for imaging at least a section of a surface of the substrate to be inspected into a detection plane by imaging the section in an imaging direction using imaging radiation, the optical system having at least one reflective optical element, and the method comprising: guiding measurement radiation, in sections, within the optical system such that the measurement radiation is reflected on the at least one reflective optical element, or passes through an opening in the at least one of the reflective optical elements, reflecting the measurement radiation on at least one point on the surface of the substrate, and determining a position of the at least one point of the substrate surface relative to the imaging direction from the reflected measurement radiation.

According to one embodiment, the inspection apparatus is configured as a microscope. In a further embodiment, the inspection apparatus is configured as an optical inspection system for inspecting substrates exposed by a microlithographic projection exposure system. Moreover, in a further embodiment the apparatus is in the form of an optical inspection system for inspecting masks for microlithography. Therefore, the inspection apparatus can be configured to calibrate mask structuring systems, and so as a so-called "registration unit" wherein position marks on a lithography mask are measured with great precision. From this measurement conclusions can be drawn regarding the writing accuracy of mask structures disposed on the lithography mask and which are intended for imaging onto a wafer.

The features specified in relation to the embodiments of the apparatus for microlithographic projection exposure listed above can be applied correspondingly to the apparatus for inspecting a surface of a substrate.

Furthermore, the features specified in relation to the embodiments of the apparatus summarized above can be applied correspondingly to the methods summarized, and vice versa. The resulting embodiments of the method are therefore hereby incorporated by this reference into the present disclosure. Furthermore, the aspects and advantages summarized above in relation to the embodiments of the apparatus therefore also apply to the corresponding embodiments of the method and vice versa.

BRIEF DESCRIPTION OF THE DRAWINGS

In the following, exemplary embodiments of an apparatus according to the invention for microlithographic projection exposure are discussed in greater detail with reference to the attached schematic drawings. These show as follows.

DETAILED DESCRIPTION OF EXEMPLARY EMBODIMENTS

In the exemplary embodiments described below any elements which are functionally or structurally similar to one another are provided as far as possible with the same or similar reference numbers. Therefore, in order to understand the features of the individual elements of a specific exemplary embodiment, reference should be made to the description of other exemplary embodiments or to the more general description of the invention.

Figure 1:
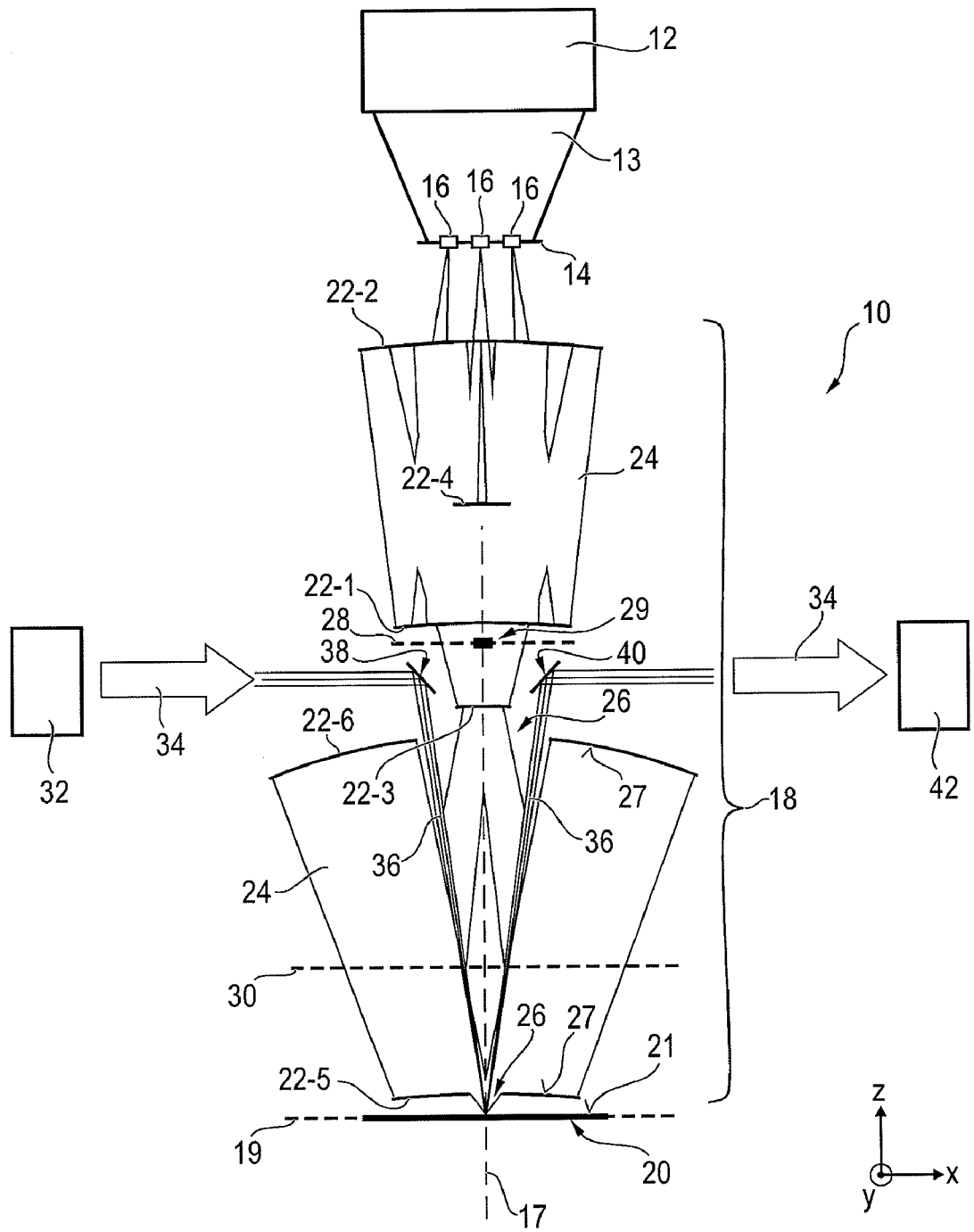
FIG. 1 a schematic side view of a first embodiment of an apparatus for microlithographic projection exposure in a first illustration plane with a greatly schematically illustrated imaging beam path and a measurement beam path, FIG. 2 a detailed illustration of the imaging beam path according to FIG. 1, FIG. 3 the imaging beam path in the schematised illustration according to FIG. 1 with an individual beam serving to illustrate the precise course of the beam, FIG. 4 a sectional view of the imaging beam path according to FIGS. 1 to 3 in a second illustration plane rotated by 90°, FIG. 5 a top view of a reflective optical element of the apparatus for microlithographic projection exposure, FIG. 6 a sectional view of a second embodiment of the apparatus for microlithographic projection exposure in the first illustration plane, FIG. 7 a sectional view of a third embodiment of the apparatus for microlithographic projection exposure in the first illustration plane, with which only the imaging beam path is drawn in, FIG. 8 the apparatus according to FIG. 7, with which only one measurement beam path is drawn in, FIG. 9 the imaging beam path according to FIG. 7 in the second illustration plane, FIG. 10 a top view of a substrate exposed by one of the apparatuses illustrated above in order to illustrate the exposure process, FIG. 11 a sectional view of a further embodiment of the apparatus for microlithographic projection exposure in the first illustration plane with which only one measurement beam path is drawn in, and FIG. 12 a sectional view of an embodiment of an apparatus for inspecting a surface of a substrate.

FIG. 1 shows a first embodiment of an apparatus 10 for microlithographic projection exposure in the form of an EUV projection exposure system in a sectional view in the x-z plane according to the coordinate system drawn in in the figure. As shown in the drawing, the apparatus 10 can be designed as a so-called step and scan exposure system, called "scanner" for short, or also as a so-called "stepper".

The apparatus 10 comprises an illumination system 12 which radiates illumination radiation 13 in the EUV wavelength range (extreme ultraviolet radiation, e.g. with a wavelength of 13.4 nm) onto a mask 14 with mask patterns 16 positioned over the latter. The mask 14 is held by a mask table 11 in the form of a so-called "reticle stage".

The apparatus 10 further comprises an optical system 18 in the form of projection optics for imaging the mask structures 16 onto a surface 21 of a substrate 20 in the form of a wafer disposed in a substrate plane 19. The apparatus 10 further comprises a substrate table 20a in the form of a so-called "wafer stage" by which the substrate 20 is held. As already mentioned above, according to the embodiment shown the apparatus is configured as a so-called "scanner". During the exposure of an area on the substrate 20, both the mask table 11 and the substrate table 20a are displaced at different speeds in the y direction according to the coordinate system shown in FIG. 1.

The optical system 18 comprises purely reflective optical elements 22 in the form of mirrors. Therefore, the optical system 18 can also be called a catoptric projection objective.

The imaging of the mask structures 16 onto the surface 21 of the substrate 20 is implemented by projecting the mask patterns in an imaging direction 17a. The imaging direction 17a extends in the direction of a reference axis 17 of the optical system 18, which according to FIG. 1 extends in the z direction. In the case where reflective optical elements 22 are rotationally symmetric, the reference axis 17 corresponds to the optical axis of the optical system.

Figure 2:
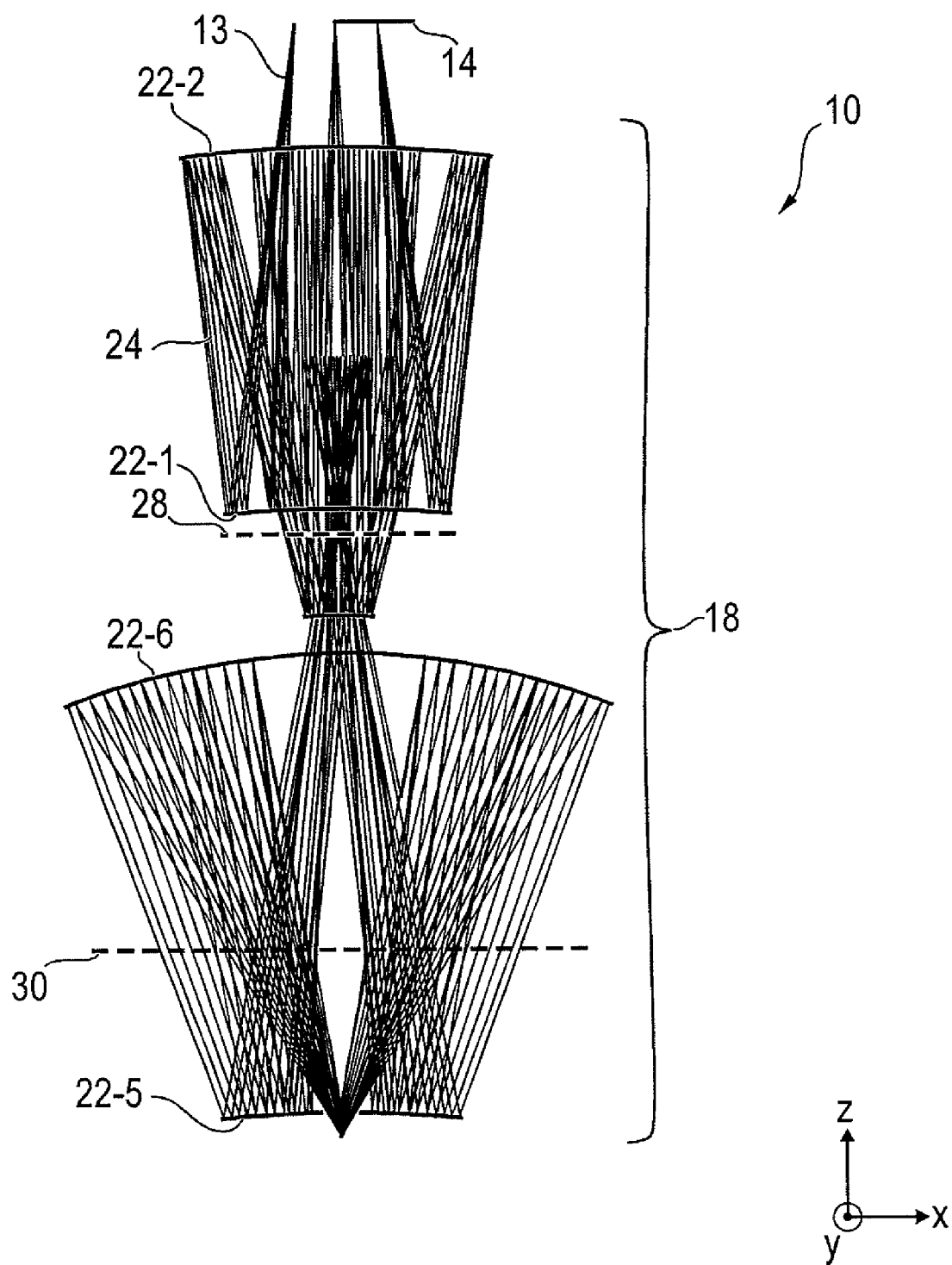
Figure 3:
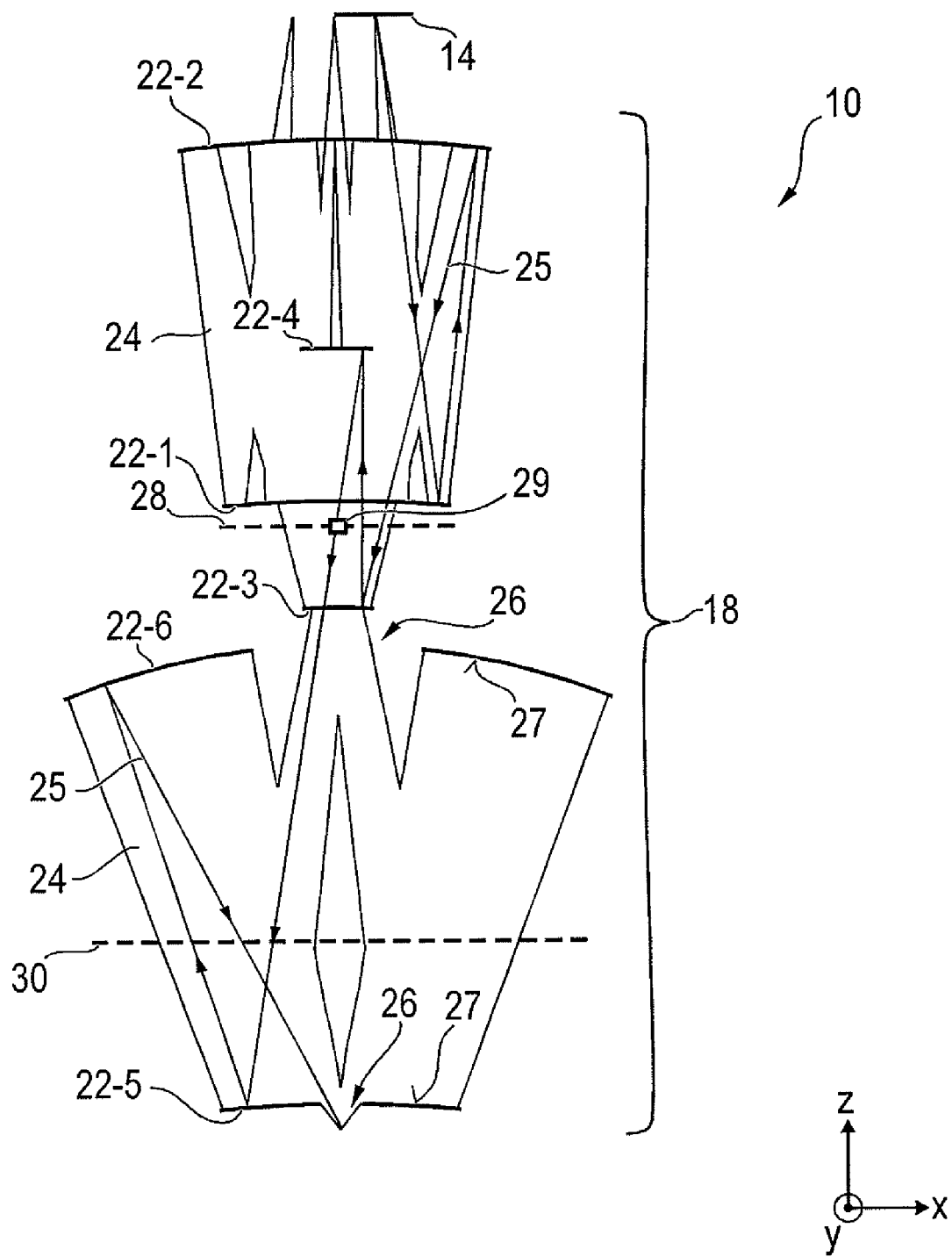

The illumination radiation 13 is transformed by the mask 14 into imaging radiation 15. The imaging radiation 15 passes through the imaging beam path 24 in the optical system 18 which is shown as an outline in FIG. 1 in order to provide a clearer illustration. FIG. 2 shows the imaging beam path 24 with a plurality of individual beams contained therein. As a further illustration of the path of the imaging radiation 15 in the optical system 18 an exemplary individual beam 25 of the imaging radiation 15 is shown in FIG. 3. As is evident from this, the imaging radiation 15 is reflected on the individual reflective optical elements 22-1 to 22-6, one after the other, in the imaging beam path 24. Here the elements 22-1 and 22-2 are respectively a concave mirror, element 22-3 is a convex mirror, element 22-4 is once again a concave mirror, element 22-5 is a convex mirror, and element 22-6 is in turn a concave mirror.

The optical system 18 has a first pupil plane 28 disposed between the reflective optical elements 22-3 and 22-4. Disposed in the first pupil plane 28 there is in a central region of the beam cross-section of the imaging radiation 15 an obscuration aperture 29, also called a shading aperture. The obscuration aperture 29 brings about area-dependent obscuration of the pupil, and is made of a material, or has a coating, which does not reflect any radiation with the exposure wavelength in the EUV wavelength range. The material substantially absorbs the incoming radiation with this wavelength.

Figure 5:
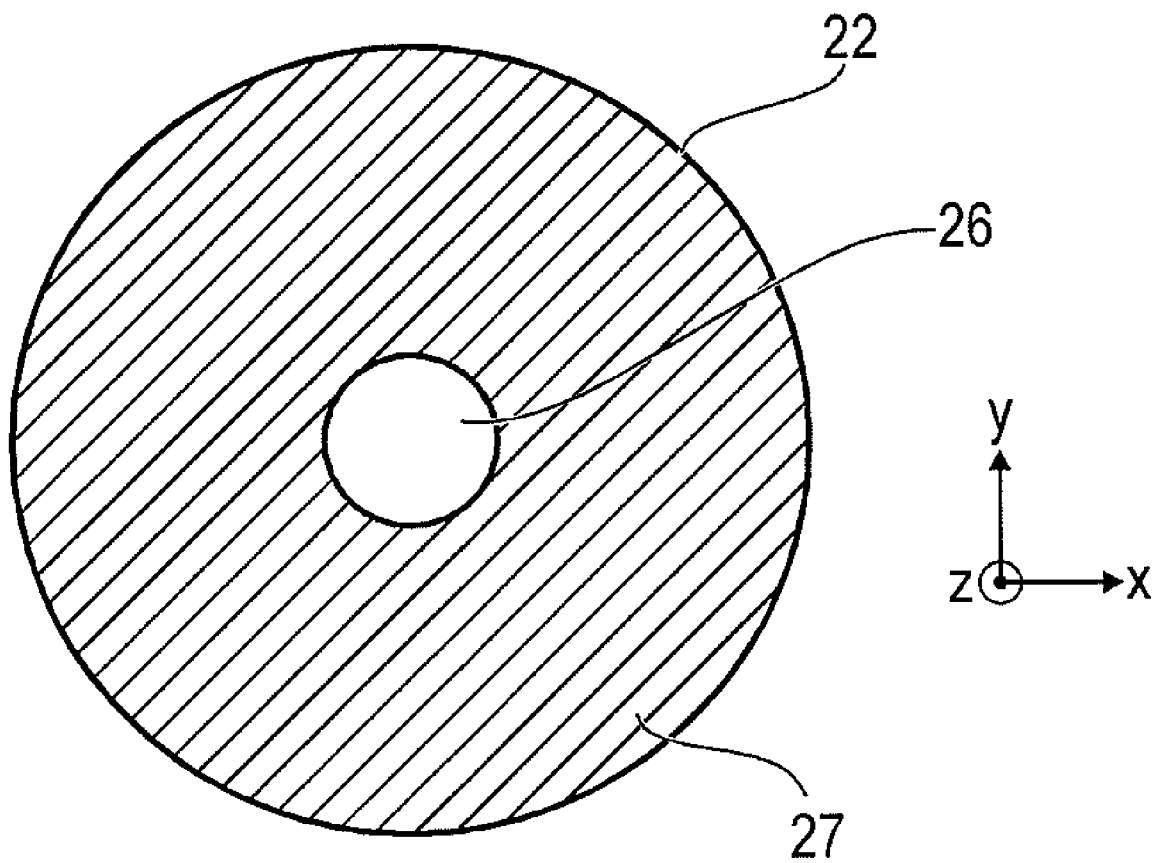

The reflective optical elements 22-5 and 22-6 downstream in the beam path 24 are disposed in a high aperture part of the optical system 18, and each have an opening 26 in the form of a central hole through the respective reflective optical surface 27. FIG. 5 shows this type of opening 26 in an exemplary reflective optical element 22. As shown in FIG. 5, the opening 26 can be in the shape of a circular disc or also have other forms. The opening 26 is disposed in a region of the reflective optical elements 22-5 and 22-6 which is at least partially shaded by the obscuration aperture 29. This type of obscuration aperture 29 can serve to prevent a high degree of light loss in the illumination beam path 24, as described, for example, in WO 2006/069725.

Furthermore, the apparatus 10 has a measurement radiation source 32 for generating measurement radiation 34. The measurement radiation 34 can have a different wavelength than the imaging radiation 15, e.g. a wavelength in the visible wavelength range, in particular e.g. 632.8 nm, in the UV wavelength range, in particular the DUV wavelength range, e.g. 248 nm, the VUV wavelength range, e.g. 193 nm, or also in the infrared range. The measurement radiation 34 is injected into the optical system 18 by a first deflection mirror 38 in the form of an injecting mirror or injecting element. The injection takes place such that the measurement beam path 36 initially passes through the opening 26 in the reflective optical element 22-6 and then through the opening 26 in the reflective optical element 22-5.

The measurement radiation 34 is then reflected on the surface 21 of the substrate 20 and passes through the openings 26 in the optical elements 22-5 and 22-6 once again. Here the measurement beam path 36 passes twice through a second pupil plane 30 conjugated to the first pupil plane 28 in a region shaded by the obscuration aperture 29. After passing through the openings 26 in the elements 22-5 and 22-6 once again, the measurement radiation 34 is steered by a second deflection mirror 40 in the form of an extracting mirror or extracting element onto a detector system 42. Since the measurement radiation 34 neither passes through nor is reflected on a series of optical elements of the optical system 18, in particular the optical elements 22-1 and 22-2, the measurement radiation 34 only partially passes through the optical system 18.

Figure 4:
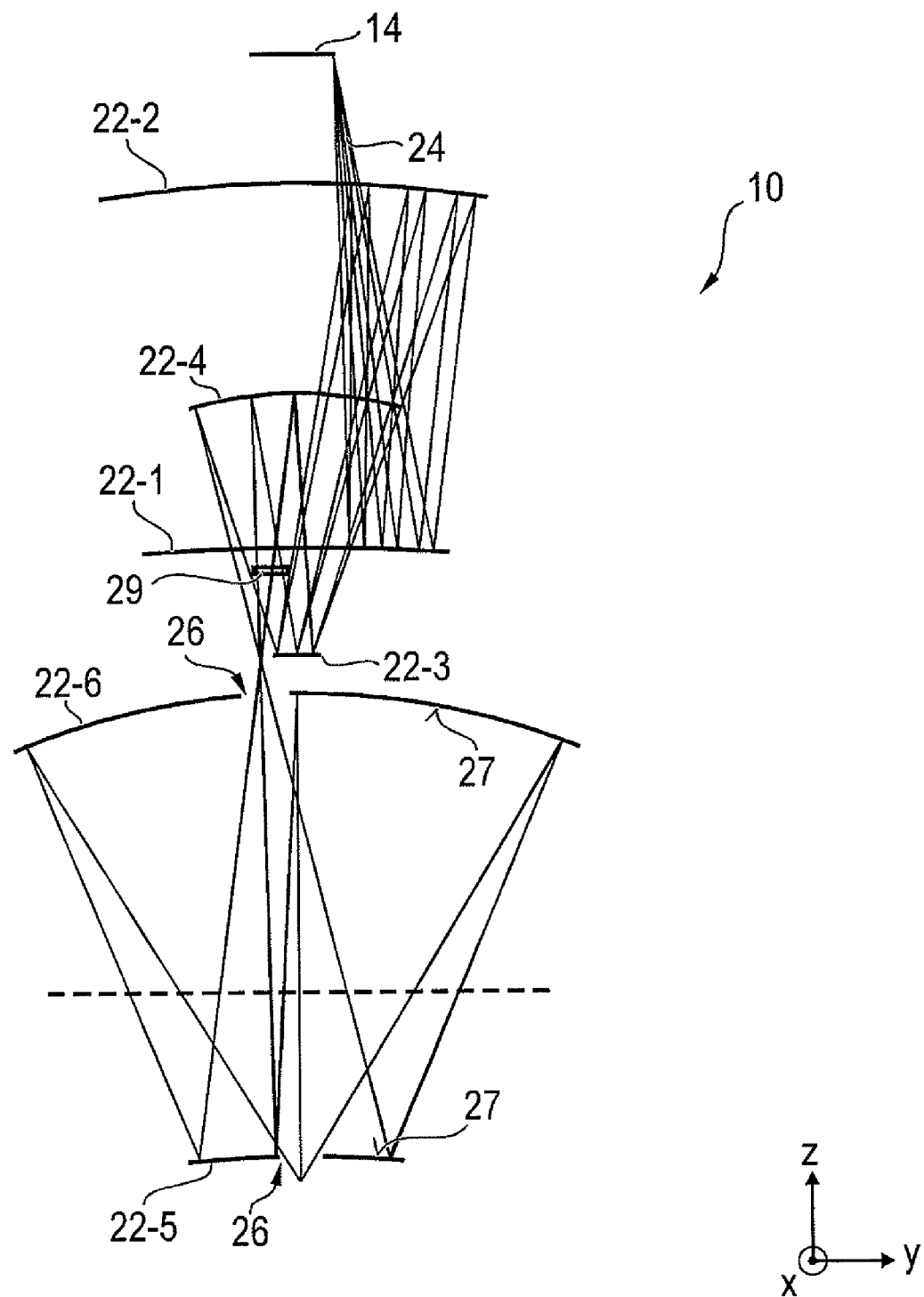

Using the detector system 42, the point or a number of points on the substrate surface 21 at which the measurement radiation 34 was reflected is/are measured as regards its/their position in the imaging direction 17a. For this purpose the detector system 42 comprises a detector and an analysis device 45 which determines the axial position of the point or the points on the substrate surface 21 to be measured from the signal recorded by the detector. Since the imaging direction 17a according to FIG. 1 extends parallel to the z coordinate axis, the z coordinate of the point or the respective z coordinates of a number of points is/are determined. This can happen, for example, by overlaying the reflected measurement radiation 34 with radiation from the measurement radiation source 32 moved past the optical system 18, as described, for example, in U.S. 2007/0080281 A1. Alternatively, the measuring principle described in U.S. Pat. No. 5,268,744 can be used with which the displacement of the substrate surface 21 in the z direction also leads to a displacement of the striking location of the measurement radiation on a detector surface in the detector system 42. Alternatively, the measuring system described in DE 4109484 C2 can also be used to analyse the reflected measurement radiation 34. FIG. 4 shows the imaging beam path 24 according to FIGS. 1 to 3 in the y-z plane. Using the measurement radiation 34, the topography of the substrate surface 21, and so the relative position of a number of points on the substrate surface 21 in relation to one another, can also be determined.

Furthermore, the measurement radiation 34 can also be used to determine the lateral position of an adjustment mark disposed on the substrate surface 21, and so be used for the alignment of the substrate 20 before it is exposed. As already explained in greater detail above, for this purpose the adjustment mark can be imaged directly onto the detector system 42. Alternatively, in addition a reference mark can be disposed in the measurement beam path 36, for example on a reference mirror. One possibility for determining the lateral position is the Moiré measuring method known in principle to the person skilled in the art.

Figure 6:
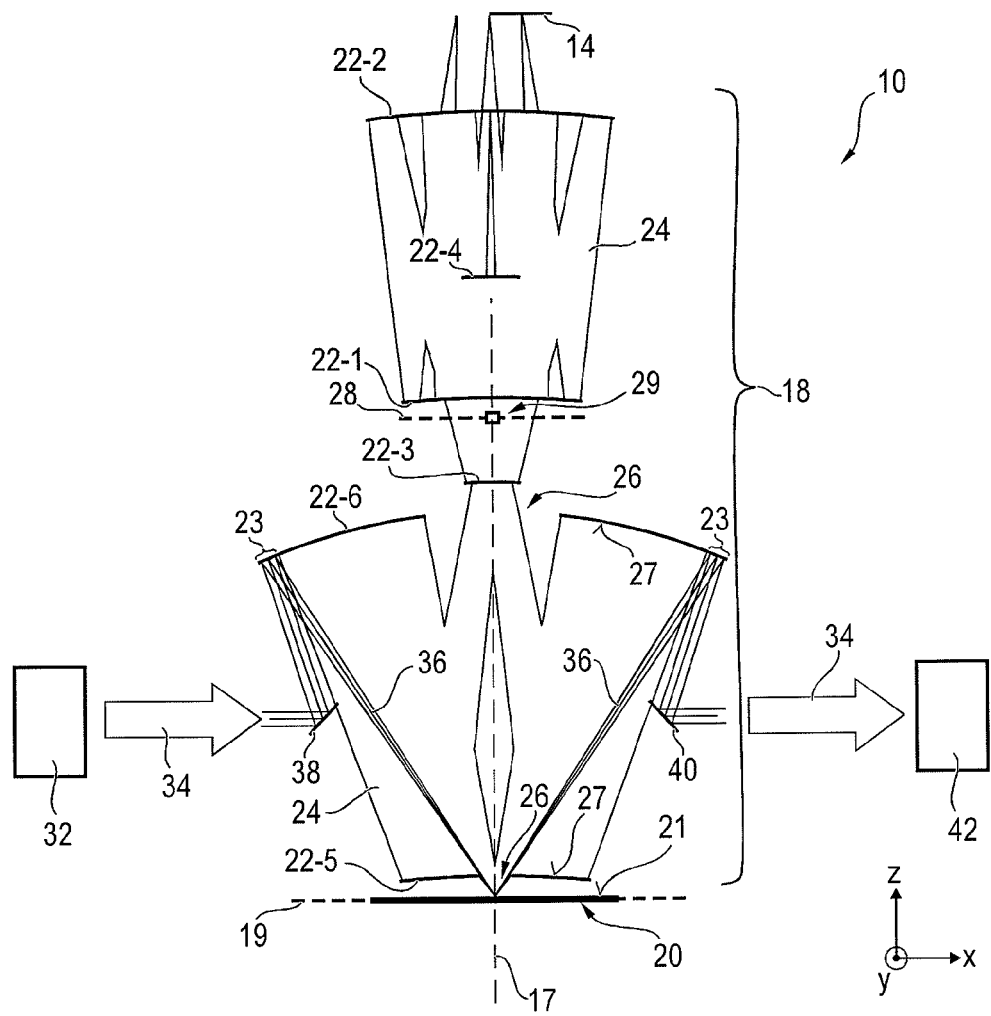

FIG. 6 shows the apparatus 10 in sections in a second embodiment in a sectional view in the x-z plane. The apparatus 10 according to FIG. 6 differs from the apparatus 10 according to FIG. 1 only in the configuration of the measurement beam path 36. The measurement beam path 36 according to FIG. 6 is configured such that after injection into the optical system 18 the measurement radiation 34 is initially reflected by the first deflection mirror 38 on the reflective optical element 22-6. The reflection takes place here on a peripheral region 23 of the reflective optical element 22-6. This peripheral region 23 can be disposed outside or inside the imaging beam path 15, and it can also partially overlap with the imaging beam path 15.

The measurement radiation 34 reflected on the peripheral region 23 then passes through the opening 26 in the reflective element 22-5, is reflected on the substrate surface 21, passes through the opening 26 in the reflective element 22-5 once again, and is then reflected again on the peripheral region 23 of the reflective element 22-6. The repeated reflection takes place on an opposing region of the peripheral region 23 with regard to the first reflection relative to the reference axis 17 of the optical system 18. The measurement radiation 34 is then steered by the second deflection mirror 40 onto the detector system 42.

Figure 7:
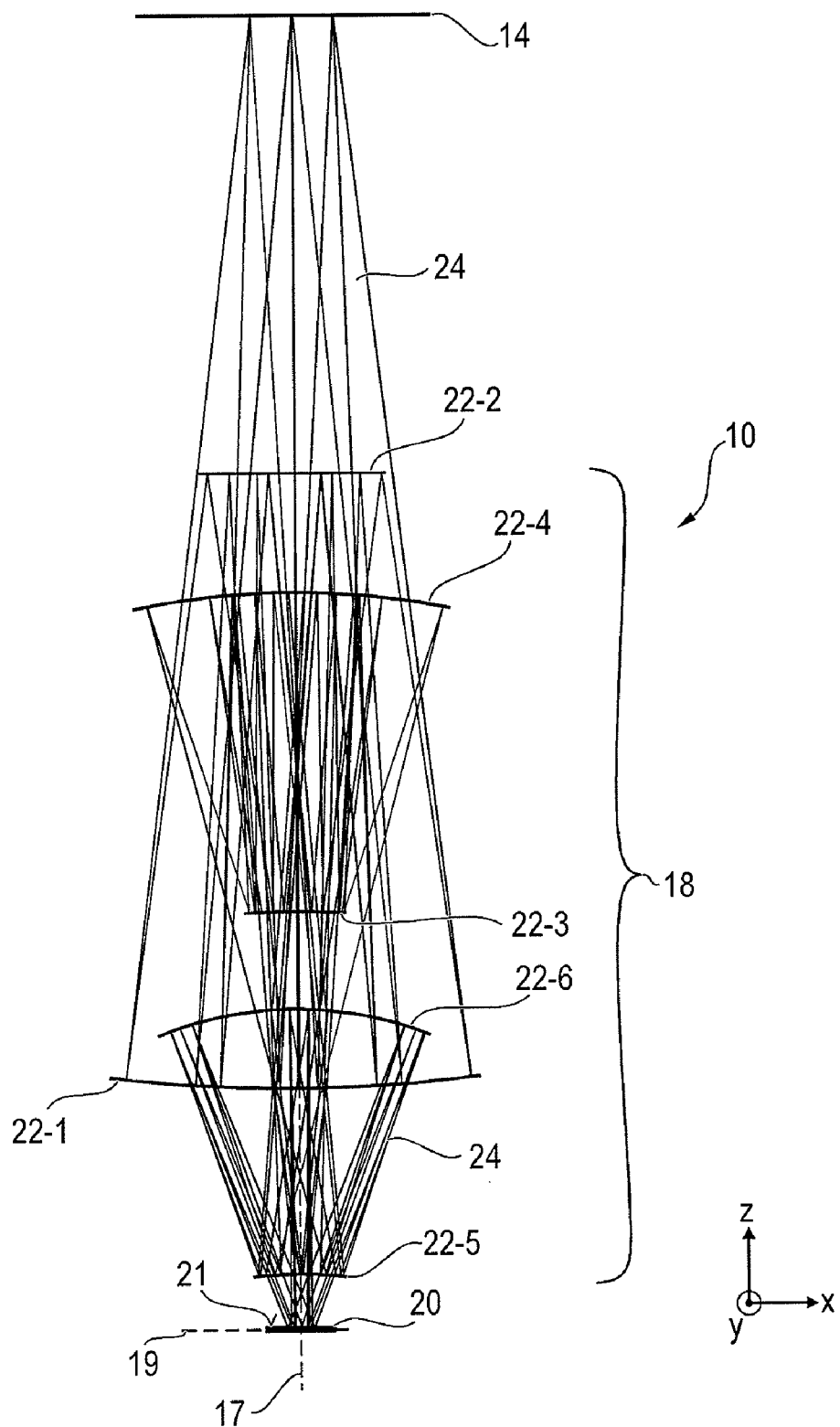
Figure 8:
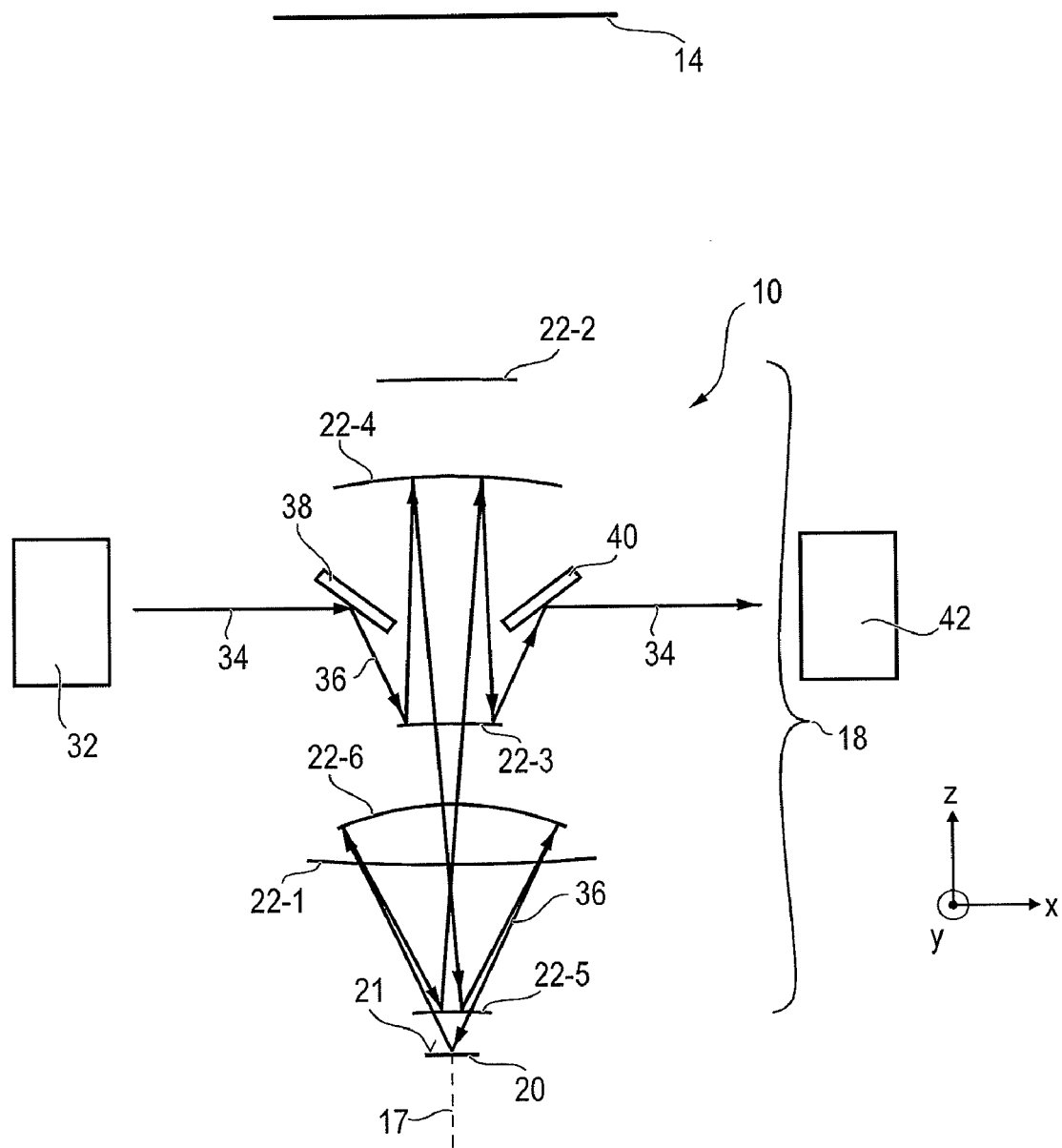
Figure 9:
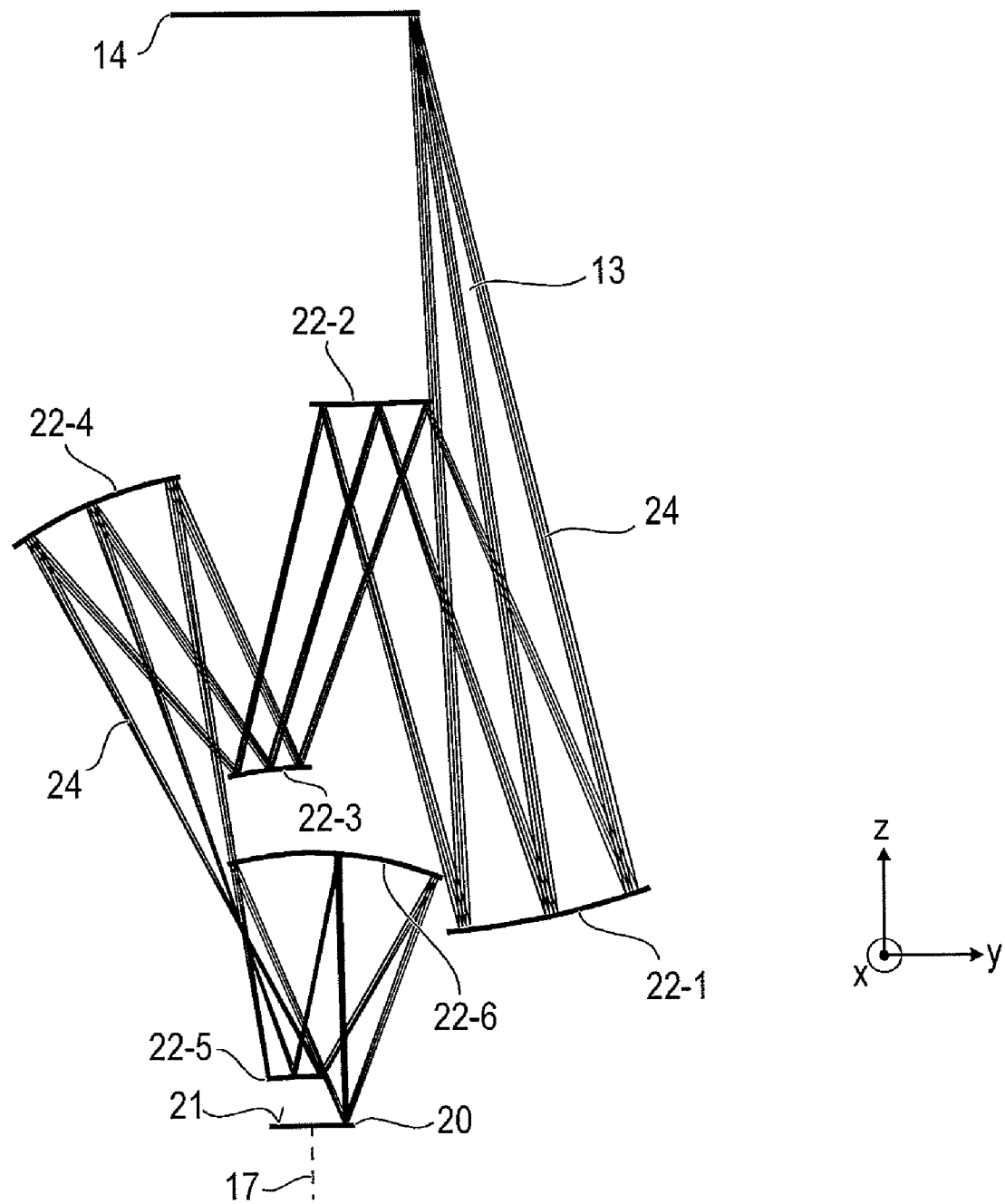

FIGS. 7 to 9 show a third embodiment of an apparatus 10 for microlithographic projection exposure. In order to provide a better illustration, in FIGS. 7 and 9 respectively only the imaging beam path 24, and in FIG. 8 only the measurement beam path 36 is shown. FIGS. 7 and 8 show the embodiment in a sectional view in the x-z plane, and FIG. 9 in a sectional view in the y-z plane.

Unlike the previously described optical systems 18, the optical system 18 according to FIGS. 7 to 9 does not have an obscuration aperture 29. As is evident from FIG. 9, the imaging radiation 15 is guided past the side of individual respective optical elements 22-1 to 22-6 before or after reflection on the optical elements in question without penetrating a reflective optical surface. Therefore, unlike the previous embodiments, the reflective optical elements 22-1 to 22-6 do not have an opening 26.

As shown by FIG. 8, the measurement beam path 36 also extends such that the measurement radiation 34 is either reflected on the reflective optical elements 22-1 to 22-6 or runs past them. Therefore, in this embodiment the measurement radiation 34 does not pass through an opening in a reflective optical element 22.

Following injection into the optical system 18 via the first deflection mirror 38, the measurement radiation 34 is reflected, one after the other, on the reflective optical elements 22-3 in the form of a convex mirror, 22-4 also in the form of a convex mirror, 22-5 also in the form of a convex mirror, and 22-6, which is also in the form of a convex mirror. The measurement radiation 34 then passes onto the substrate surface 21 and passes through the optical system 18 by reflection on the aforementioned elements in the opposite sequence before it is steered onto the detector system 42 by the second deflection mirror 40.

Figure 10:
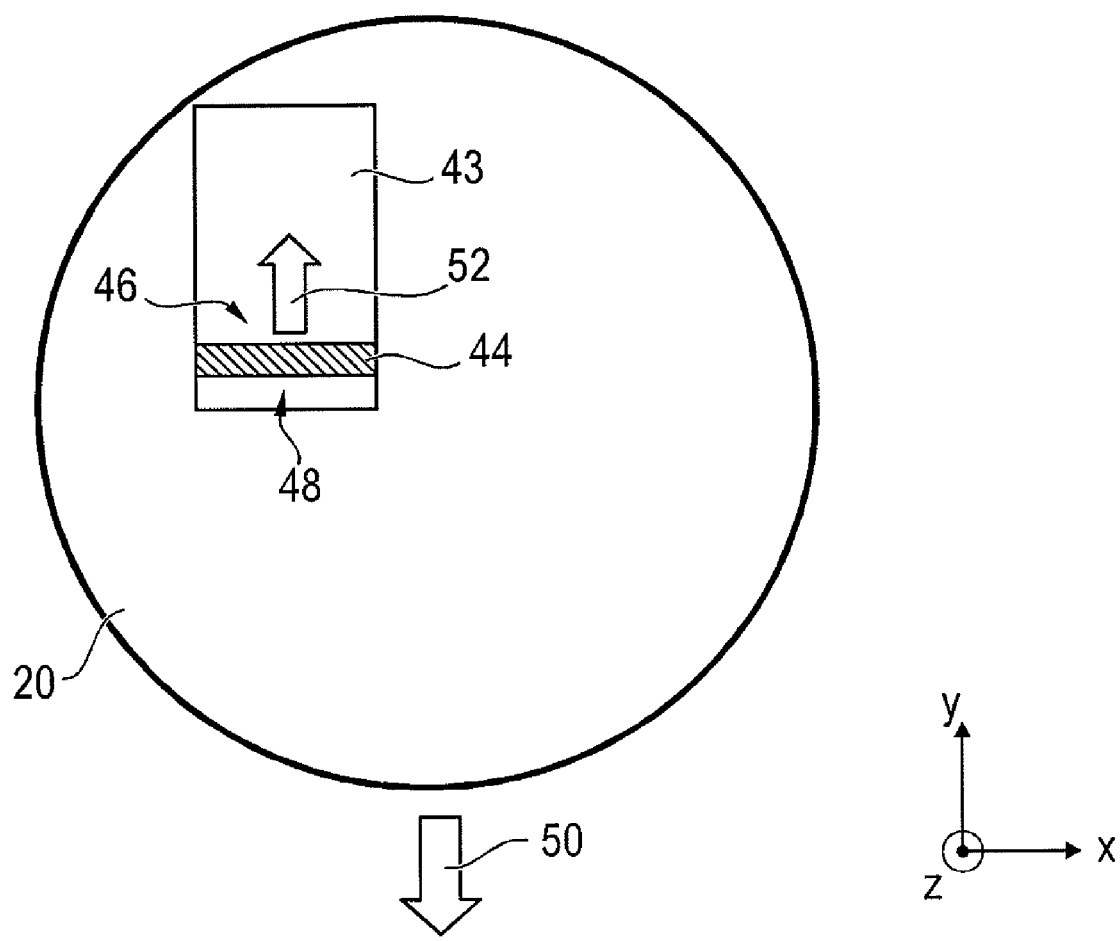

FIG. 10 shows a top view of the substrate 20 in the form of a wafer with an area 43 to be exposed drawn in as an example. In the case where the apparatus 10 is designed as a "scanner", the exposure beam radiating onto the substrate is formed such that the latter exposes a slot-shaped area 44 at a given point in time. This slot-shaped area can be rectangular or also in the shape of a ring segment. During scan operation the substrate 20 is scanned in the y direction 50 relative to the fixed optical system 18. The effect of this is that the slot-shaped exposed area 44 is effectively scanned in the opposite direction 52.

In all of the embodiments of the apparatus 10 described above, the measurement beam path 36 can be configured in three different variations. In a first variation the measurement radiation 34 is directed towards a point or a region within the slot-shaped exposed area 44 at the time when it is exposed. Therefore, a simultaneous measurement of the surface properties of the substrate surface 21 is taken during the scanning process. In a second variation, the measurement radiation 34 is directed at a section 46 of the substrate 20 running ahead of the exposed area 44. In a third variation the measurement radiation 34 is, in contrast, directed at section 48 of the substrate 20 running behind the exposed area 44.

In a further embodiment of the apparatus 10, a point on the substrate surface 21 is measured, as regards its position lateral to the imaging direction 17a, at two different times during the scanning movement of the substrate 20. From this the scanning speed and the lateral displacement speed of the substrate 20 is determined.

In a further embodiment, of the apparatus 10, the measurement radiation 34 generated by the measurement radiation source 32 has at least two different wavelengths. The radiation detector 42 is wavelength-resolving and determines the respective intensity of the measurement radiation 34 following reflection on the substrate surface 21 for the at least two different wavelengths. From the radiation intensities the temperature of the substrate surface 21 is then determined in the same way as with the function of an infrared thermometer.

In a further embodiment of the apparatus 10, during operation of the apparatus 10, a reduction in intensity of the measurement radiation 34 upon passing through the optical system 18 is determined, and from this a concentration of a gas contained in the optical system 18 is determined.

Figure 11:
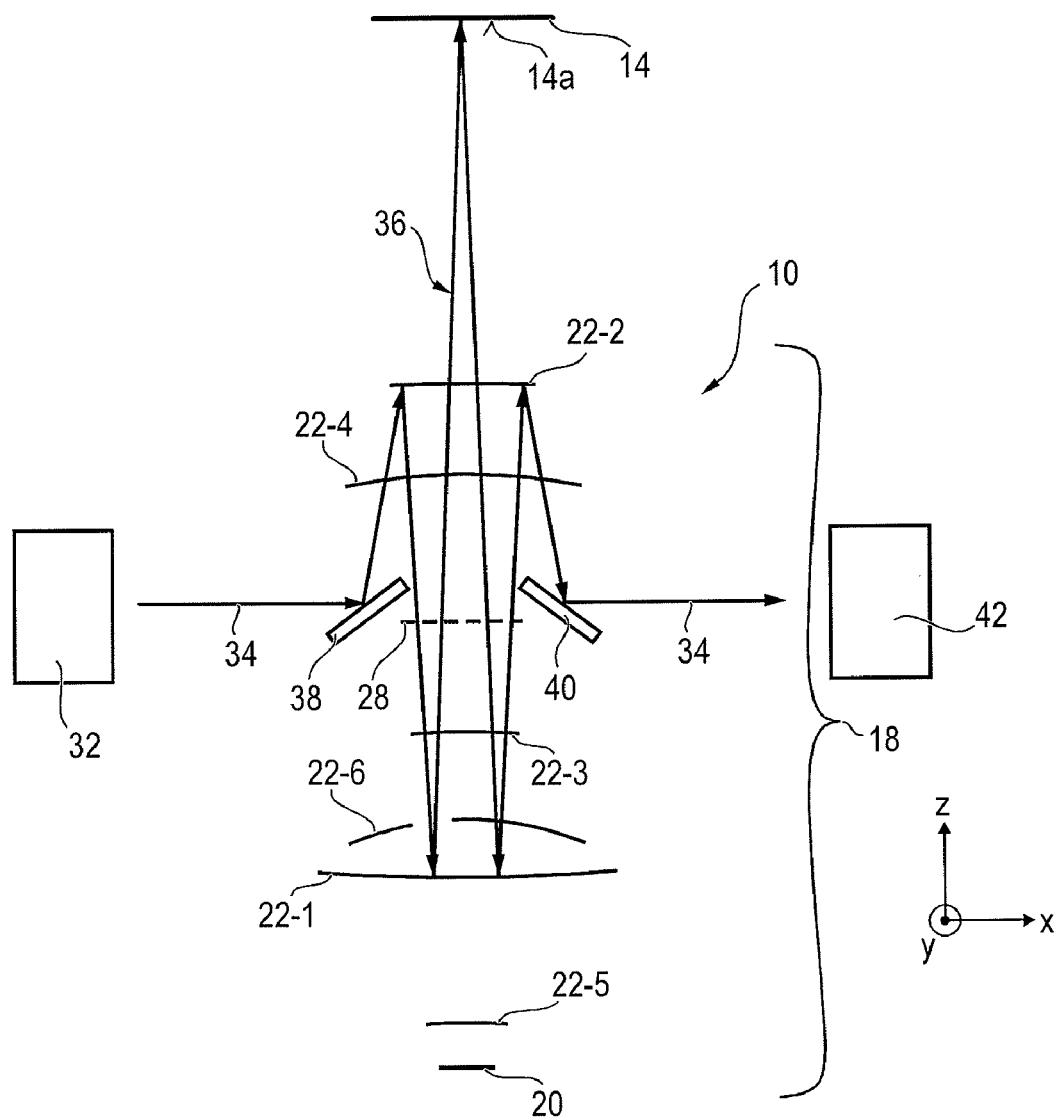

FIG. 11 shows a further embodiment of the apparatus 10 for microlithographic projection exposure. With this embodiment, the measurement beam path 36 is formed such that during operation of the apparatus 10 the measurement radiation 34 is reflected on a surface 14a of the mask 14 facing towards the optical system 18. Therefore, for example, the position of a point of the mask surface 14a or also the topography of the mask surface 14a can be determined. Also, other properties of the apparatus specified above with regard to the embodiment with which the measurement radiation 34 is reflected on the substrate 20 can be determined.

Figure 12:
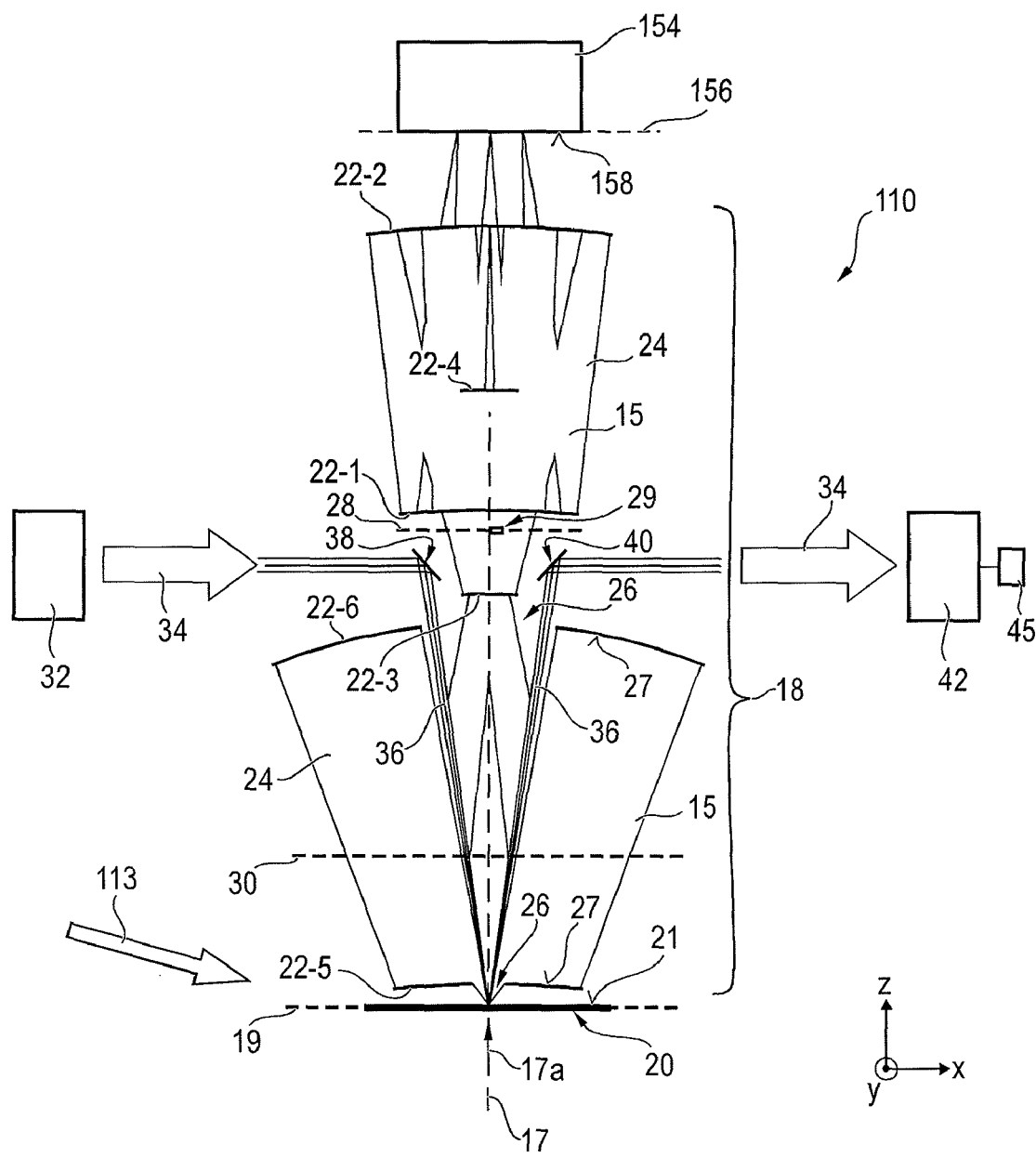

FIG. 12 shows an embodiment of an apparatus 110 for inspecting a surface of a substrate 20. This can be a microscope or an optical inspection system, e.g. for the inspection of lithography masks or for the inspection of exposed wafers. The apparatus can also be configured to calibrate mask shaping systems, and so as a so-called "registration unit" with which position marks on a lithography mask are measured with high precision. From this measurement conclusions can be drawn regarding the writing precision of mask structures disposed on the lithography mask and intended to image into a wafer.

The substrate 20 can therefore be a semiconductor wafer, a lithography mask or generally an object to be inspected. The apparatus 110 only differs from the previously described apparatuses 10 for microlithographic projection exposure in that the imaging takes place in the opposite imaging direction 17a. The substrate 20 is illuminated by illumination radiation 113 radiated at an angle. The imaging radiation 15 remitted from the surface 21 of the substrate 20 passes through the imaging beam path 24 of the optical system 18 in the opposite direction in comparison to the apparatus 10. A section of the surface 21 to be inspected is imaged onto a detection surface 158 of a detection device 154 disposed in a detection plane 156 and is thereby detected.

The apparatus 110 comprises a measurement beam path 36 formed in the same way as the measurement beam path 36 according to FIG. 1. The embodiments shown in FIGS. 2 to 5 can be correspondingly applied to the apparatus 110 in the embodiment according to FIG. 12. Furthermore, the apparatus 110 can be realized in further embodiments similar to the apparatuses 110 according to FIGS. 6 to 9.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An apparatus for microlithographic projection exposure comprising:
   a catoptric system comprising a plurality of optical elements and configured to image mask structures onto a surface of a substrate by projecting the mask structures with imaging radiation having an extreme ultraviolet or shorter wavelength, and structure defining a measurement beam path and configured to guide measurement radiation, the measurement beam path extending within the catoptric system, wherein at least two of the optical elements are included in the measurement beam path, and the measurement radiation passes only partially through the catoptric system during operation of the apparatus.

2. The apparatus according to claim 1, further comprising an optical injecting element configured to inject the measurement radiation into the catoptric system.

3. The apparatus according to claim 1, further comprising an optical extracting element configured to extract the measurement radiation from the catoptric system.

4. The apparatus according to claim 1, wherein the catoptric system comprises at least one reflective optical element with an opening, and the measurement beam path extends within the catoptric system such that the measurement radiation passes through the opening in the at least one reflective optical element.

5. The apparatus according to claim 1, wherein the measurement beam path is configured to measure a position of at least one point of the substrate surface with the measurement radiation guided by the measurement beam path.

6. The apparatus according to claim 1, wherein the measurement beam path extends at least once through a pupil plane of the catoptric system.

7. The apparatus according to claim 1, wherein the structure is configured to determine a position of at least one point of the substrate surface at an overlapping time with the imaging of the mask structures onto the substrate surface.

8. The apparatus according to claim 1, wherein the catoptric system comprises at least one reflective optical element, and the measurement beam path extends within the catoptric system such that the measurement radiation is reflected on the at least one reflective optical element.

9. The apparatus according to claim 1, wherein the measurement beam path is configured such that the measurement radiation is reflected on the surface of the substrate.

10. The apparatus according to claim 1, wherein the mask structures being imaged are disposed on a mask, and the measurement beam path is configured such that the measurement radiation is reflected on a surface of the mask facing the catoptric system.

11. The apparatus according to claim 8, wherein the measurement beam path is configured such that the measurement radiation is reflected twice on the at least one reflective optical element.

12. The apparatus according to claim 9, further comprising a measurement radiation source which generates the measurement radiation with at least two different wavelengths, and a wavelength-resolving radiation detector which is configured to measure a respective intensity of the measurement radiation for each of the at least two different wavelengths following reflection of the measurement radiation on the substrate, and is configured to determine a temperature on the substrate surface from the measured intensities.

13. The apparatus according to claim 10, further comprising a mask table configured to displace laterally to an imaging direction and a control device configured to control at least the mask table in accordance with a position measurement of at least one point of a substrate surface lateral to the imaging direction at two different times, the position measurements corresponding to a lateral displacement speed of the mask table.

14. An apparatus for inspecting a surface of a substrate comprising:

a catoptric system comprising a plurality of optical elements and configured to image at least one section of a surface of a substrate being inspected into a detection plane by imaging the section with imaging radiation having an extreme ultraviolet or shorter wavelength, and structure defining a measurement beam path and configured to guide measurement radiation, the measurement beam path extending within the catoptric system, wherein the measurement radiation passes only partially through the catoptric system during operation of the apparatus.

15. The apparatus according to claim 14, which is configured as a microscope.

16. The apparatus according to claim 14, which is configured as an optical inspection system for inspecting substrates exposed by a microlithographic projection exposure system.

17. The apparatus according to claim 14, which is configured as an optical inspection system for inspecting masks for microlithography.

18. The apparatus according to claim 14, further comprising an optical injecting element configured to inject the measurement radiation into the catoptric system.

19. The apparatus according to claim 14, further comprising an optical extracting element configured to extract the measurement radiation from the catoptric system.

20. The apparatus according to claim 14, wherein the catoptric system comprises at least one reflective optical element with an opening, and the measurement beam path extends within the catoptric system such that the measurement radiation passes through the opening in the at least one reflective optical element.

21. The apparatus according to claim 14, wherein the measurement beam path is configured to measure a position of at least one point of the substrate surface with the measurement radiation guided by the measurement beam path.

22. The apparatus according to claim 14, wherein the measurement beam path extends at least once through a pupil plane of the catoptric system.

23. The apparatus according to claim 14, wherein the catoptric system comprises at least one reflective optical element, and the measurement beam path extends within the catoptric system such that the measurement radiation is reflected on the at least one reflective optical element.

24. The apparatus according to claim 14, wherein the measurement beam path is configured such that the measurement radiation is reflected on the surface of the substrate.

25. The apparatus according to claim 23, wherein the measurement beam path is configured such that the measurement radiation is reflected twice on the at least one reflective optical element.

26. The apparatus according to claim 24, further comprising a measurement radiation source which generates the measurement radiation with at least two different wavelengths, and a wavelength-resolving radiation detector which is configured to measure a respective intensity of the measurement radiation for each of the at least two different wavelengths following reflection of the measurement radiation on the substrate, and is configured to determine a temperature on the substrate surface from the measured intensities.

27. A method for determining a property of an arrangement which comprises an apparatus for microlithographic projection exposure and a substrate disposed in an exposure position of the apparatus, comprising:

configuring catoptric system to image mask structures onto a surface of the substrate and projecting the mask structures with imaging radiation having an extreme ultraviolet or shorter wavelength, guiding measurement radiation within the catoptric system along a measurement beam path such that at least two but less than all optical elements of the catoptric system are included in the measurement beam path, and determining the property of the arrangement from the guided measurement radiation.

28. The method according to claim 27, wherein said guiding comprises reflecting the measurement radiation on at least two points on the surface of the substrate, and wherein said determining comprises determining a topography of at least one section of the surface of the substrate from the reflected measurement radiation.

29. A method for determining a property of an arrangement which comprises an inspection apparatus and a substrate, which is disposed in an inspection position in the inspection apparatus, comprising:

configuring a catoptric system to image at least one section of a surface of the substrate into a detection plane and imaging the section with imaging radiation having an extreme ultraviolet or shorter wavelength along an imaging beam path, guiding measurement radiation within the catoptric system along a measurement beam path such that the measurement beam path comprises a part but less than all of the imaging beam path, and determining the property of the arrangement from the guided measurement radiation.

30. The method according to claim 29, wherein said guiding comprises reflecting the measurement radiation on at least two points on the surface of the substrate, and wherein said determining comprises determining a topography of at least one section of the surface of the substrate from the reflected measurement radiation.

* * * * *

UNITED STATES PATENT AND TRADEMARK OFFICE
CERTIFICATE OF CORRECTION

PATENT NO. : 8,345,267 B2
APPLICATION NO. : 12/895747
DATED : January 1, 2013
INVENTOR(S) : Hans-Juergen Mann and Wolfgang Singer Page 1 of 1

It is certified that error appears in the above-identified patent and that said Letters Patent is hereby corrected as shown below:

In the Specifications:

Column 7, Line 20: delete "radiationa" and insert -- radiation. --

In the Claims:

Column 19, Line 1: In Claim 27, delete "catoptric" and insert -- a catoptric --

Signed and Sealed this
Third Day of September, 2013

Teresa Stanek Rea
*Acting Director of the United States Patent and Trademark Office*